(12) United States Patent
Li et al.

(10) Patent No.: US 6,573,123 B2
(45) Date of Patent: Jun. 3, 2003

(54) SEMICONDUCTOR CHIP PACKAGE AND MANUFACTURING METHOD THEREOF

(76) Inventors: Sai Man Li, 13F-3, No. 97, Chorng-Shinn Street, East District, Tainan (TW); Chun Hung Lin, 9F, No. 72, Hua-Feng Street, Kaohsiung (TW); Shin Hua Chao, No. 6, 63 Nong, 56 Lane, Ho-Hwang Street, Kaohsiung (TW); Su Tao, No 72-2, Chorng-Shyr New Village, Kaohsiung (TW)

( * ) Notice: Subject to any disclaimer, the term of this patent is extended or adjusted under 35 U.S.C. 154(b) by 13 days.

(21) Appl. No.: 10/029,845

(22) Filed: Dec. 31, 2001

(65) Prior Publication Data

US 2002/0056903 A1 May 16, 2002

Related U.S. Application Data

(62) Division of application No. 09/390,695, filed on Sep. 7, 1999, now Pat. No. 6,348,729.

(51) Int. Cl.[7] .............................................. H01L 21/44
(52) U.S. Cl. ...................... 438/123; 438/106; 438/121; 438/125; 438/118
(58) Field of Search ................................ 438/123, 106, 438/121, 125, 118

(56) References Cited

U.S. PATENT DOCUMENTS

| | | |
|---|---|---|
| 5,252,855 A | 10/1993 | Ogawa et al. |
| 5,776,800 A | 7/1998 | Hamburgen et al. |
| 5,780,931 A | 7/1998 | Shimoda et al. |
| 5,894,108 A | 4/1999 | Mostafazadeh et al. |
| 5,936,303 A * | 8/1999 | Nishi .......................... 257/675 |
| 6,117,710 A * | 9/2000 | Mostafazadeh et al. ..... 438/106 |
| 6,194,250 B1 | 2/2001 | Melton et al. |

FOREIGN PATENT DOCUMENTS

JP    401315169 A    12/1989

* cited by examiner

Primary Examiner—Albert W. Paladini
Assistant Examiner—Luan Thai

(57) ABSTRACT

A semiconductor chip package generally comprises a lead frame, a semiconductor die and a plastic package body. The lead frame includes a plurality of leads and a window pad. The window pad is connected to the lead frame by connecting bars. The inner ends of the plurality of leads defines a central area. The window pad is disposed in the central area and has an opening defined therein. The semiconductor die is disposed in the opening of the window pad and has a plurality of bonding pads formed on the active surface thereof. The inner ends of the leads are interconnected to the bonding pads on the semiconductor die through a plurality of bonding wires. The lead frame, the semiconductor die and the bonding wires are encapsulated in the plastic package body wherein the lower surface of the lead frame and the backside surface of the semiconductor die are exposed through the plastic package body.

16 Claims, 6 Drawing Sheets

SEMICONDUCTOR CHIP PACKAGE AND MANUFACTURING METHOD THEREOF

This application is a Divisional of application Ser. No. 09/390,695 filed Sep. 7,1999 U.S. Pat. No. 6,348,729.

BACKGROUND OF THE INVENTION

1. Field of the Invention

This invention generally relates to an electronic device, and more particularly to a semiconductor chip package and a manufacturing method thereof, wherein a semiconductor die is encapsulated by a plastic package body in a manner that the backside surface of the die is exposed through the plastic package body.

2. Description of the Related Art

FIG. 1 depicts a conventional semiconductor chip package including a lead frame for supporting a semiconductor die 100. The lead frame includes a plurality of leads having outer lead portions 106 and inner ends 107. The die 100 is attached onto a die pad 111 by means of a silver paste 114. The die pad 111 is connected to the lead frame by supporting bars (not shown in FIG. 1). The outer lead portions 106 are used for electrical coupling to an outside circuit. The die 100 has bonding pads 117 electrically interconnected to the inner ends 107 of the lead frame though bonding wires 115. The die 100, the die pad 111, the inner ends 107 of the lead frame and bonding wires 115 are encapsulated in a plastic package body 116 made of insulating material such as epoxy.

Because the plastic package body 116 completely surrounds the die 100, the heat generated from the die 100 during normal operation must pass through the package body 116 to outside. Due to the insulating properties of the package body 116, heat dissipation from the die 100 is resisted, thereby creating, in some instances, high temperatures within the conventional package which might impair or damage the die 100.

SUMMARY OF THE INVENTION

It is a primary object of the present invention to provide a semiconductor chip package comprising a lead frame having a window pad for the supply of ground potential and a die enclosed in a plastic package body, wherein the lower surface of the lead frame and the backside surface of the die are exposed through the plastic package body for improving the thermal performance of the semiconductor chip package.

It is another object of the present invention to provide a semiconductor chip package comprising a lead frame and a die enclosed in a plastic package body, wherein predetermined portions of the surface of the lead frame are provided with a cupric oxide coating for enhancing the adhesion between the lead frame and the plastic package body.

A semiconductor chip package in accordance with a preferred embodiment of the present invention generally comprises a lead frame, a semiconductor die and a plastic package body. The lead frame includes a window pad having an opening defined therein and a plurality of leads having inner ends defining a central area. The window pad is connected to the lead frame by connecting bars and disposed within the central area. The semiconductor die is disposed in the opening of the window pad and has a plurality of bonding pads formed on the active surface thereof. The inner ends of the leads are interconnected to the bonding pads on the semiconductor die through a plurality of bonding wires. The plastic package body encapsulates the lead frame, the semiconductor die and the bonding wires wherein the lower surface of the lead frame and the backside surface of the semiconductor die are exposed through the plastic package body.

Since the lower surface of the lead frame and the backside surface of the semiconductor die are exposed through the plastic package body, the heat generated from the die during normal operation can be directly dissipated by convection and radiation from the backside surface of the die and the lower surface of the lead frame to the surrounding air and the outside environment thereby enhancing the thermal performance of the semiconductor chip package of the present invention.

In a semiconductor chip package in accordance with another preferred embodiment of the present invention, the lead frame has a cupric oxide coating formed on the predetermined portions of the surface thereof. Since the cupric oxide coating has a contour of roughness, the bonding mechanism of the interface between the cupric oxide coating and the plastic package body includes chemical bonding as well as mechanical interlock thereby greatly enhancing the adhesion between the lead frame and the plastic package body. Accordingly, the probability of delamination of the metal-plastic interface is significantly reduced such that the moisture from surrounding can be prevented from directly diffusing through the exposed bond line between the lead frame and the package body into the semiconductor chip package.

The present invention further provides a method for producing a semiconductor chip package comprising the steps of: (A) attaching a adhesive tape to a surface of a lead frame in a manner that an opening of a window pad of the lead frame is covered by the adhesive tape; (B) attaching a semiconductor die to the adhesive tape within the opening of the window pad; (C) electrically coupling the semiconductor die to the lead frame; (D) encapsulating the lead frame and the semiconductor die in a plastic package body; and (E) removing the adhesive tape to expose a lower surface of the lead frame and the backside of the die.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
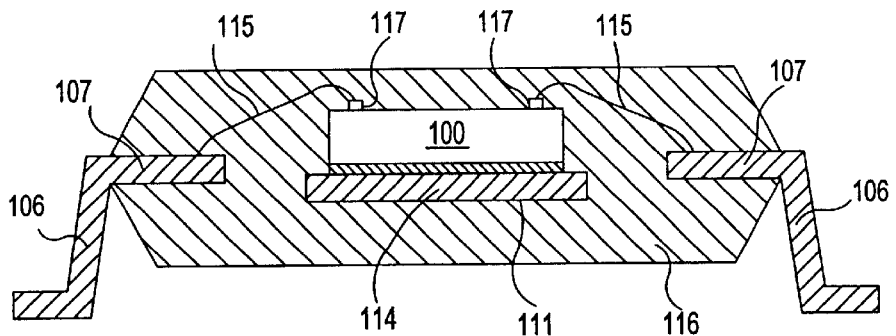
FIG. 1 a cross sectional view of a conventional semiconductor chip package.
Figure 2:
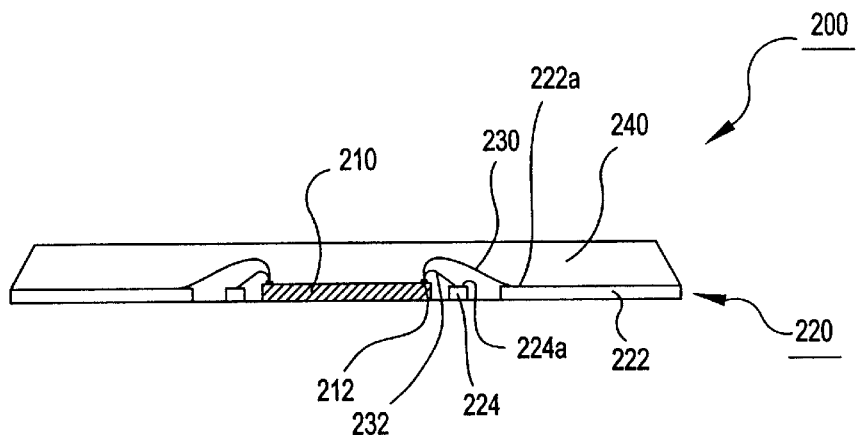
FIG. 2 a cross sectional view of a semiconductor chip package according to a first embodiment present invention.
Figure 3:
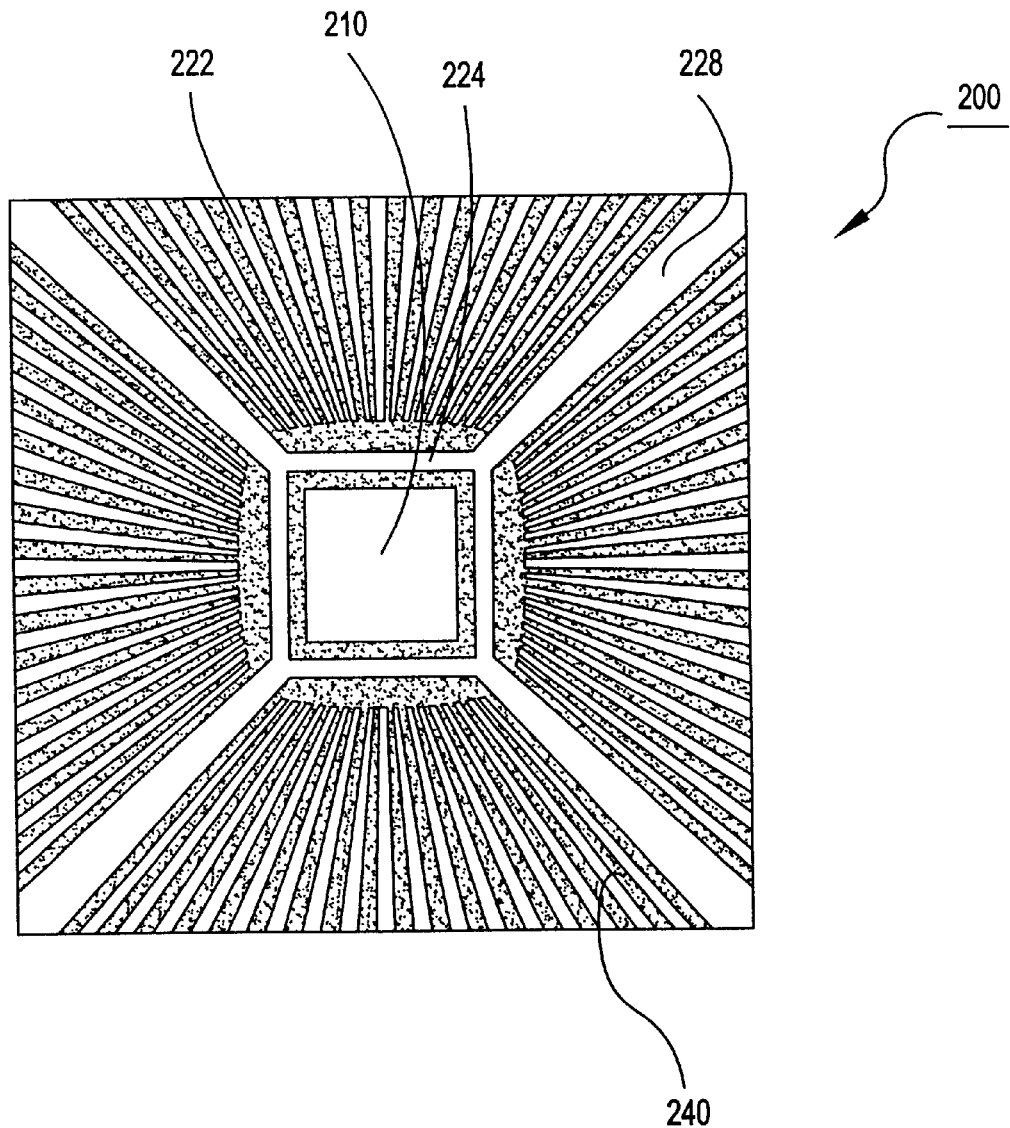
FIG. 3 a bottom plan view of the semiconductor chip package of FIG. 2.

FIG. 2 and FIG. 3 illustrate various views of a semiconductor chip package 200 according to a first embodiment of the present invention comprising a semiconductor die 210, a lead frame 220 and a plastic package body 240.

Figure 4:
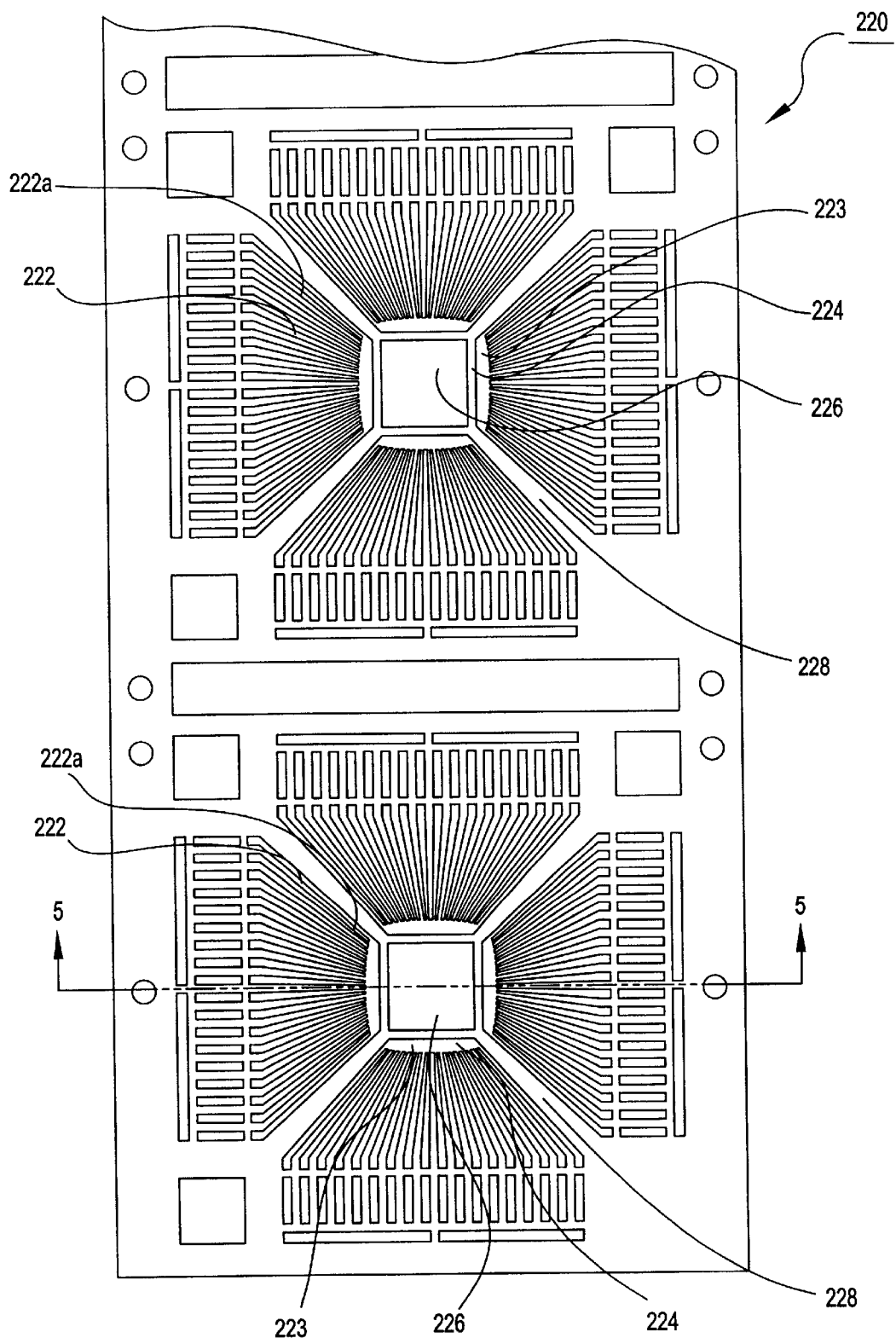
FIG. 4 top plan view of one part of a lead frame employed in the first embodiment of the present invention.

FIG. 4 illustrates one part of the lead frame 220 employed in the semiconductor chip package 200. The lead frame 220 includes a plurality of leads 222 and a window pad 224. Inner ends 222a of the leads 222 define a central area 223. The window pad 224 is disposed in the central area 223 and has an opening 226 for receiving the semiconductor die 210. Each corner of the window pad 224 is respectively connected to the lead frame 220 by a connecting bar 228.

Referring to FIG. 2, FIG. 3 and FIG. 4, the active surface of the semiconductor die 210 is provided with a plurality of bonding pads 212. The inner lead portion 222a of each lead 222 is respectively interconnected to the corresponding bonding pad 212 of the die 210 through a bonding wire such as a gold wire 230. Preferably, the inner ends 222a of the leads 222 are plated with a layer of metal (not shown), such as gold or silver, which bonds well with conventional bonding wire material. The predetermined portions 224a of the window pad 224 are electrically connected to the corresponding bonding pads 212 on the semiconductor die 210 through bonding wires such as gold wires 232 for supplying source voltage and ground potential. Preferably, the predetermined portions 224a of the window pad 224 are plated with a layer of metal (not shown), such as silver or gold, which bonds well with conventional bonding wire material. The plastic package body 240 encapsulates the semiconductor die 210, the lead frame 220 and the bonding wires 230, 232 wherein the lower surface of the lead frame 220 (i.e. the lower surfaces of the plurality of leads 222, the window pad 224 and the four connecting bars 228) and the backside surface of the semiconductor die 210 are exposed through the plastic package body 240.

Figure 5:
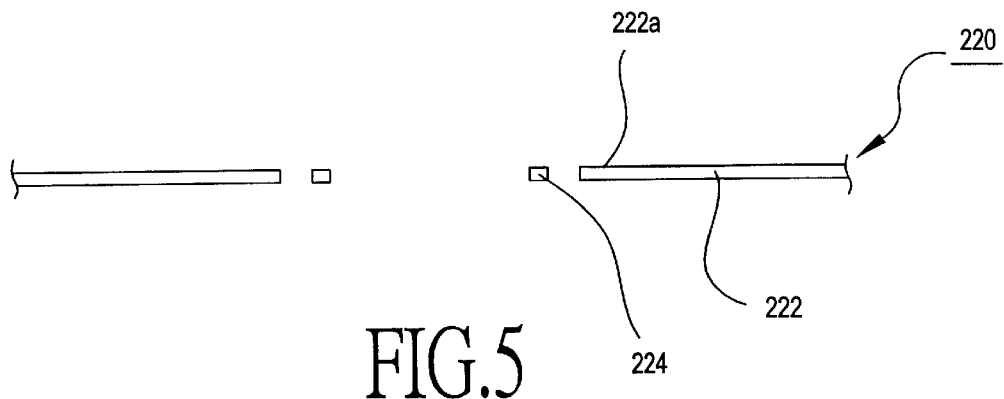
FIG. 5 a partially cross sectional view taken form the line 5—5 of FIG. 4.

Referring to FIG. 5, the lead frame 220 is formed from a thin metal strip which has been etched or stamped to form a pattern similar to that shown in FIG. 4. Preferably, the lead frame 220 is made of copper or alloys containing copper. Alternatively, the lead frame is made of iron, nickel or alloys thereof, and then plated with copper.

FIGS. 6–10 show a method for producing a semiconductor chip package in accordance with the present invention.

Figure 6:
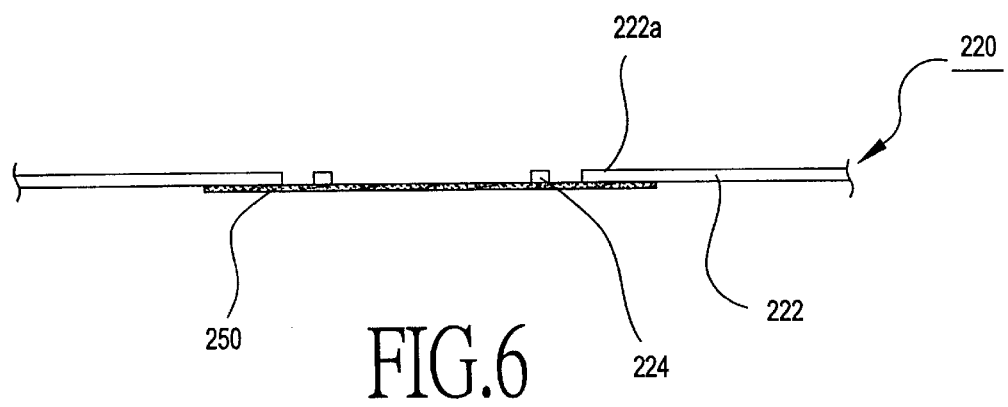
FIG. 6–10 are cross sectional views for illustrating a method for producing a semiconductor chip package in accordance with the present invention.
Figure 11:
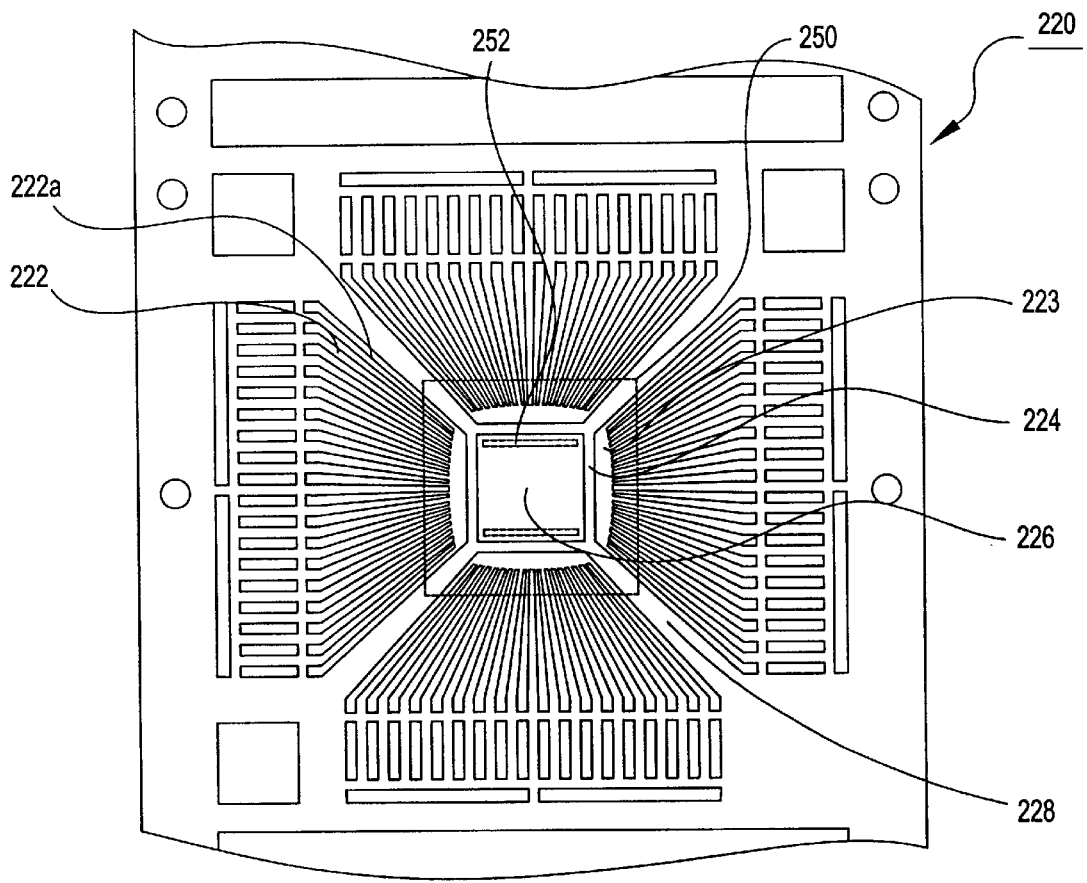
FIG. 11 is a top plan view of one part of a lead frame mounted on a adhesive tape employed in the first embodiment of the present invention.

Referring to FIG. 6, the lead frame 220 is mounted on an adhesive tape 250 such as polyimide with an adhesive layer. The adhesive tape 250 is used to support the die 210 during the assembly process and to maintain the die 210 in a proper position relative to lead frame 220. In addition, the adhesive tape 250 can also keep the inner ends 222a of the leads 222 at their desired position during the wire bonding operation. Since the thermoplastic material typically melts at 100° C. and the wire bonding of the inner ends 222a to the semiconductor die 210 occurs when both are heated to 250° C., the adhesive layer made of thermoplastic material may be softened during the wire bonding process such that the die can't be maintained in a proper position thereby causing bonding problems. Therefore, the adhesive layer is preferably made of thermosetting material such as epoxies, silicones or polyamides. Preferably, the adhesive tape 250 has slots 252 (referring to FIG. 11) formed therein to allow the adhesive tape 250 to expand and contract as it is heated or cooled without moving the semiconductor die 210 attached thereon.

Figure 7:
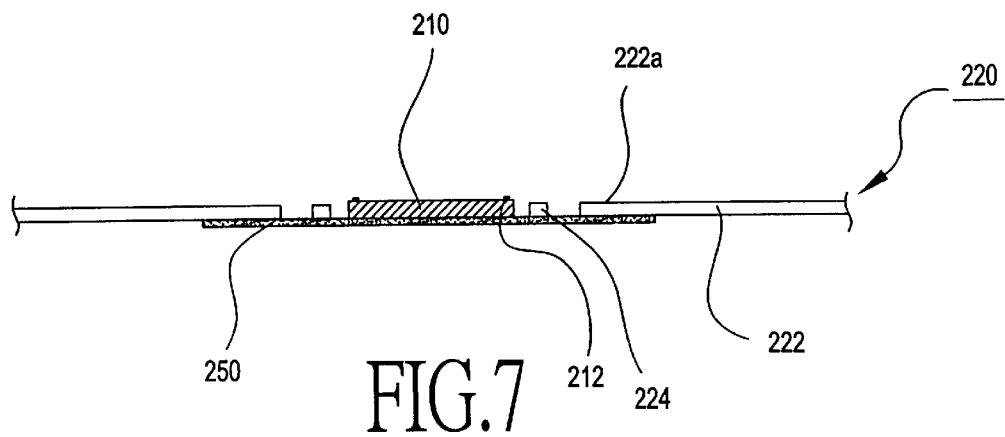

Referring to FIG. 7, the semiconductor die 210 is mounted on the adhesive tape 250 within the opening of the window pad 224. The backside surface of the die 210 is securely attached onto the adhesive tape 250 through an adhesive layer (not shown) made of thermosetting material.

Figure 8:
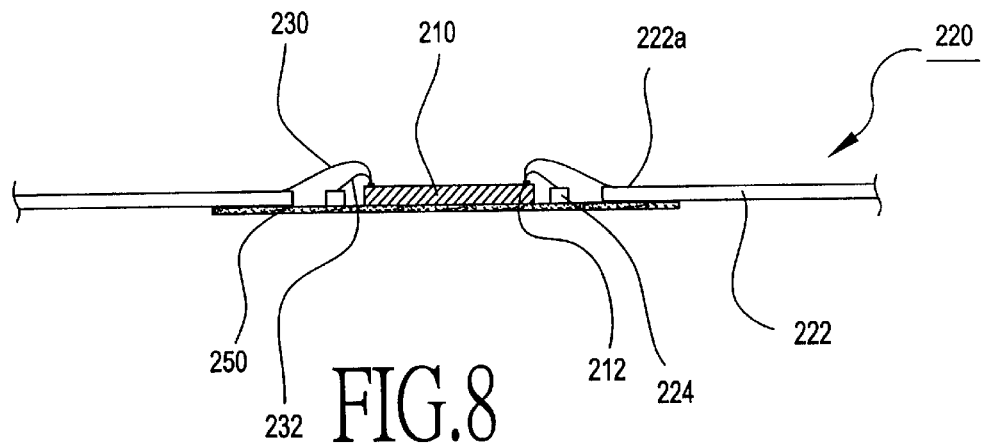

Referring to FIG. 8, the gold wires 230 are connected to the inner ends 222a of the leads 222 and the corresponding bonding pads 212 using known wire bonding techniques.

The gold wires 232 are connected to the predetermined portions 224a of the surface of the window pad 224 and the corresponding bonding pads 212 using known wire bonding techniques.

Figure 9:
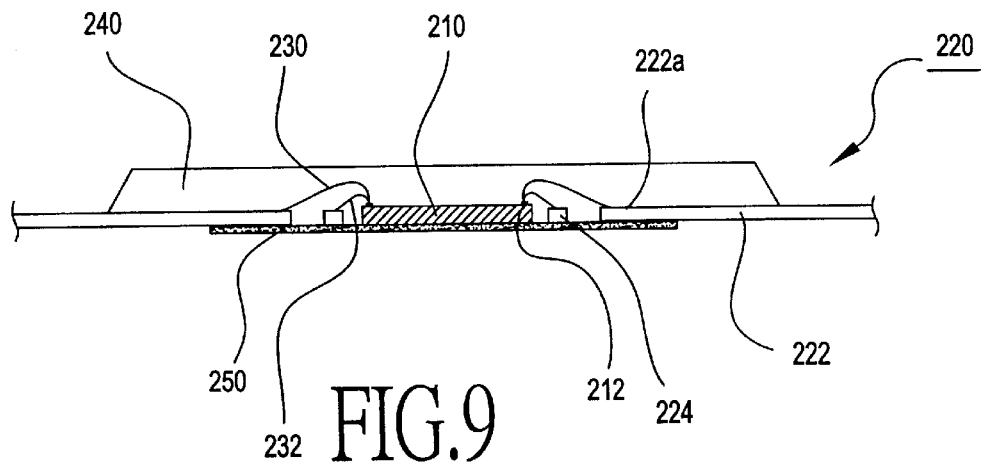

Referring to FIG. 9, the plastic package body 240 is formed over the die 210 and the lead frame 220 using known plastic molding methods such as transfer molding.

Figure 10:
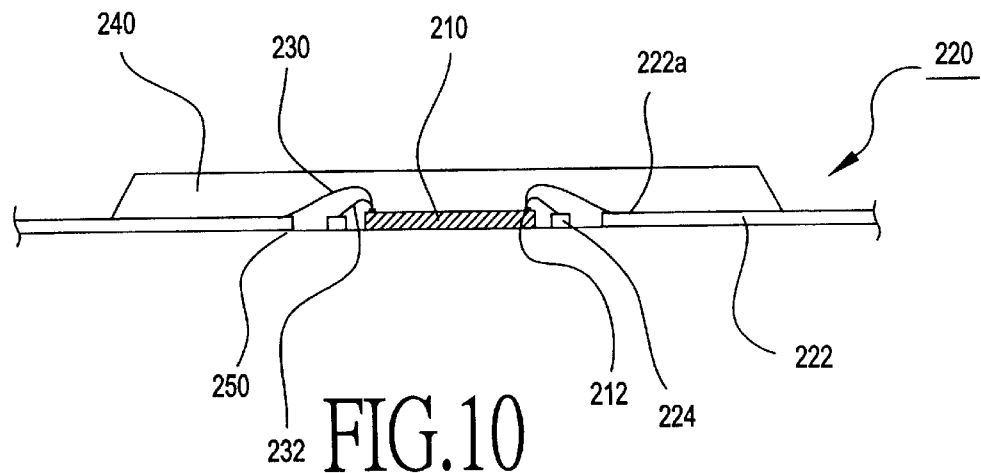

Finally, as shown in FIG. 10, the adhesive tape 250 is removed to expose the backside surface of the die 210 and the lower surface of the lead frame 220. The semiconductor chip package 200 as shown in FIG. 2 can be obtained by trimming the plurality of leads 222 such that they are flush with the side surface of the plastic package body 240. It should be understood that the plurality of leads 222 can be trimmed such that parts of them still extend outwardly of the plastic package body 240, which, in turn, are formed into standard lead configurations such as gull-wing, J-lead or the like.

Figure 12:
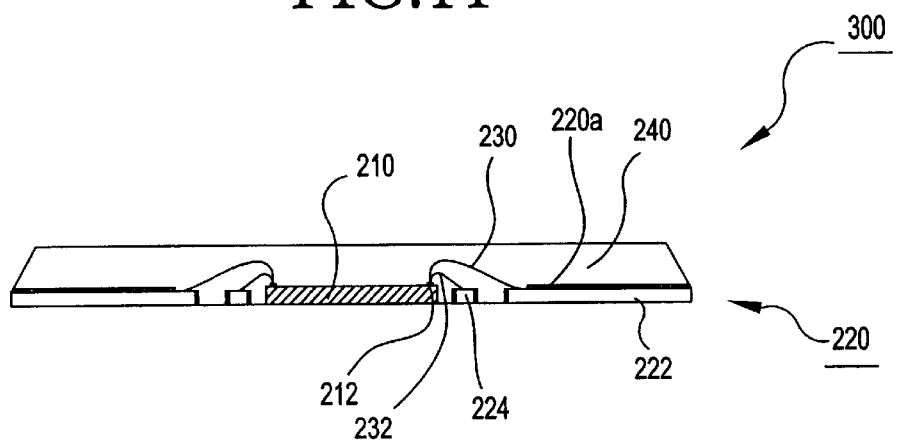
FIG. 12 is a cross sectional view of a semiconductor chip package according to a second embodiment of the present invention.

FIG. 12 illustrates a semiconductor chip package 300 according to a second embodiment of the present invention. The package 300 is identical to the package 200 of FIG. 2 with exception that the upper surface of the lead frame 220 is provided with a cupric oxide coating 220a. Preferably, the cupric oxide coating 220a is formed by the method of anodic oxidation: (A) The lead frame is degreased, cleaned and polished; (B) Areas on the lead frame at which it is undesired to form a cupric oxide coating are protected by tapes, e.g., the lower surface of the lead frame and the inner ends of the lead frame; (C) The lead frame with protective tapes is electrolyzed as the anode in an alkaline solution such as sodium hydroxide electrolytic solution, thereby forming a cupric oxide coating on the surface of the lead frame without protection of tapes. The principal crystal structure of the cupric oxide coating layer is composed of acicular crystals which are black in color and densely packed; hence, the cupric oxide coating has a rough appearance with a color of black. Alternatively, the cupric oxide coating 220a on the lead frame according to the present invention can be formed by the method of chemical oxidation: the step (A) and step (B) is identical the method described above; (C') The lead frame with protective tapes is immersed in a chemical oxidation solution (such as water solution of 3% sodium chloride, 1% sodium hydroxide and 1% sodium phosphate by weight) and heated at 85° C.

The inner ends of the leads and the predetermined portions of the die pad for grounding can be previously plated with a layer of metal which bonds well with conventional bonding wire material, e.g., gold or silver, protected by tapes, and then subjected to the step (C). It should be understood that the lead frame in accordance with the present invention can be previously treated with steps (A) and (C), and then the cupric oxide coating formed thereon can be removed from areas on the lead frame at which it is undesirable to form a cupric oxide coating (e.g., the lower surface of the lead frame and the inner ends of the lead frame) by mechanical abrasion or chemical etching.

The semiconductor chip package 200 according to a first embodiment of the present invention can be mounted to a substrate, such as a circuit board, like other leadless devices. For example, a PC board is screened printed with a solder paste in a pattern which corresponds to the pattern of the leads exposed from the bottom surface of the semiconductor chip package 200. The package 200 is then appropriately positioned on the PC board and the solder is reflowed. It should be understood that the exposed portions of the leads of the package 200 can be printed with solder paste and then mounted to a substrate.

When a leadless device is mounted to a substrate, stress occurs at the interface therebetween as the device experiences temperature changes. The stress is generally maximum at four corners of the device. According to the present invention, since the connecting bars for connecting the window pad to the lead frame are exposed at four corners of the bottom surface of the chip package 200, the connecting bars can be printed with solder paste and then reflowed to secure to the substrate thereby reinforcing and stabilizing the bonding between the chip package 200 and the substrate, and enhancing the solder joint reliability therebetween.

According to the present invention, the inner ends of the plurality of leads are used for bonding to the receiving or transmitting pads of the die, while the window pad is used for supplying the source voltage and ground potential. Thus, according to the chip package of the present invention, the source voltage and ground potential can be supplied in any desired positions through the window pad, so it is possible to shorten the source voltage or ground potential feed lines to suppress power source noises and attain speed-up of the operation of the chip.

According to the semiconductor chip package of the present invention, since the lower surface of the lead frame and the backside surface of the semiconductor die are exposed through the plastic package body, the heat generated from the die during normal operation can be directly dissipated by convection and radiation from the backside surface of the die and the lower surface of the lead frame to the outside environment thereby facilitating rapid heat dissipation from the die; hence, the thermal performance of the package can be enhanced.

Furthermore, since the cupric oxide coating formed on the lead frame is composed of acicular crystals which are black in color and densely packed, the molding compound will flow into the gaps among the acicular crystals during the encapsulating process. After curing, the molding compound will fill the gaps thereby providing mechanical interlock mechanism to enhance the adhesion between the cupric oxide coating and the plastic package body. Accordingly, the probability of an internal delamination between the lead frame and the plastic package body is significantly reduced, and the moisture from surrounding can be prevented from directly diffusing through the exposed bond line between the lead frame and the package body into the package thereby improving the problems of package cracking during manufacturing processes with rapid temperature increases such as IR reflow.

Although the invention has been explained in relation to its preferred embodiment, it is to be understood that many other possible modifications and variations can be made without departing from the spirit and scope of the invention as hereinafter claimed.

What is claimed is:

1. A method of manufacturing a semiconductor chip package, comprising the steps of:
    providing a lead frame having first and second opposite surfaces, said lead frame including a window pad and a plurality of leads having inner ends defining a central area, the window pad being disposed in the central area and having an opening defined therein;
    forming a cupric oxide coating on predetermined portions of the first surface of the lead frame;
    attaching an adhesive tape to the second surface of the lead frame in a manner that the opening of the window pad is covered by the adhesive tape;
    attaching a semiconductor die to the adhesive tape within the opening of the window pad, the die having a plurality of bonding pads formed thereon;
    wire bonding the bonding pads on the semiconductor die to the inner ends of the leads;
    encapsulating the lead frame and the semiconductor die in a plastic package body; and
    removing the adhesive tape.

2. The method as claimed in claim 1, wherein the cupric oxide coating is formed by means of anodic oxidation.

3. The method as claimed in claim 1, wherein the cupric oxide coating is formed by means of chemical oxidation.

4. The method as claimed in claim 1, wherein the adhesive tape is attached to the second surface of the lead frame by a thermosetting adhesive.

5. The method of claim 4, wherein the thermosetting adhesive is made of one selected from the group consisting of epoxies, silicones, and polyamides.

6. The method as claimed in claim 1, wherein the semiconductor die is attached to the adhesive tape within the opening of the window pad by a thermosetting adhesive.

7. The method of claim 6, wherein the thermosetting adhesive is made of one selected from the group consisting of epoxies, silicones, and polyamides.

8. The method of claim 1, further comprising trimming outer portions of the leads that extend outwardly beyond the package body so that the leads become flush with side surfaces of the package body.

9. The method of claim 1, wherein the package body is formed such that the leads still partially extend outwardly beyond the package body.

10. The method of claim 1, wherein the semiconductor die and the lead frame are attached to the same surface of the adhesive tape.

11. The method of claim 1, wherein the cupric oxide coating is formed such that the inner ends of the leads are devoid of said cupric oxide coating.

12. The method of claim 1, wherein the cupric oxide coating is formed such that the second surface of the lead frame is devoid of said cupric oxide coating.

13. A method of manufacturing a semiconductor chip package, comprising the steps of:
    providing a lead frame including a window pad and a plurality of leads having inner ends defining a central area, the window pad being disposed in the central area and having an opening defined therein;
    attaching an adhesive tape to a surface of the lead frame in a manner that the opening of the window pad is covered by the adhesive tape, wherein the adhesive tape has at least one slot;
    attaching a semiconductor die to the adhesive tape within the opening of the window pad, the die having a plurality of bonding pads formed thereon;
    wire bonding the bonding pads on the semiconductor die to the inner ends of the leads; encapsulating the lead frame and the semiconductor die in a plastic package body; and removing the adhesive tape.

14. The method of claim 13, further comprising trimming outer portions of the leads that extend outwardly beyond the package body so that the leads become flush with side surfaces of the package body.

15. The method of claim 13, wherein the package body is formed such that the leads still partially extend outwardly beyond the package body.

16. The method of claim 13, wherein the semiconductor die and the lead frame are attached to the same surface of the adhesive tape.

* * * * *